(12) United States Patent
Yu et al.

(10) Patent No.: US 10,340,349 B2
(45) Date of Patent: Jul. 2, 2019

(54) METHOD OF FORMING SEMICONDUCTOR STRUCTURE

(71) Applicant: United Microelectronics Corp., Hsinchu (TW)

(72) Inventors: Kun-Huang Yu, New Taipei (TW); Shih-Yin Hsiao, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/799,692

(22) Filed: Oct. 31, 2017

(65) Prior Publication Data

US 2018/0069089 A1 Mar. 8, 2018

Related U.S. Application Data

(62) Division of application No. 14/937,514, filed on Nov. 10, 2015, now abandoned.

(30) Foreign Application Priority Data

Oct. 2, 2015 (TW) .............................. 104132650 A (51) Int. Cl.
| | |
|---|---|
| *H01L 21/28* | (2006.01) |
| *H01L 29/49* | (2006.01) |
| *H01L 29/66* | (2006.01) |
| *H01L 49/02* | (2006.01) |
| *H01L 29/423* | (2006.01) |
| *H01L 29/788* | (2006.01) |
| *H01L 27/11521* | (2017.01) |

(52) U.S. Cl.
CPC .. *H01L 29/42328* (2013.01); *H01L 21/28273* (2013.01); *H01L 27/11521* (2013.01); *H01L 28/00* (2013.01); *H01L 29/66545* (2013.01); *H01L 29/66825* (2013.01); *H01L 29/788* (2013.01); *H01L 29/4966* (2013.01)

(58) Field of Classification Search
CPC . H01L 51/5056; H01L 51/56; H01L 51/0072; C09K 11/06; C09K 2211/1007
USPC ........................................................ 438/201
See application file for complete search history.

(56) References Cited

U.S. PATENT DOCUMENTS

| | | | |
|---|---|---|---|
| 5,960,270 A | 9/1999 | Misra et al. | |
| 6,184,114 B1 * | 2/2001 | Lukanc | H01L 21/82384 257/E21.444 |
| 6,368,923 B1 * | 4/2002 | Huang | H01L 21/82345 257/E21.623 |
| 6,884,677 B2 | 4/2005 | Kim | |

(Continued)

*Primary Examiner* — Andy Huynh
(74) *Attorney, Agent, or Firm* — J.C. Patents (57) ABSTRACT

A method of forming a semiconductor structure is disclosed. A substrate having a first area and a second area is provided, wherein a first surface of the first area is lower than a second surface of the second area. A first insulating layer, a first gate, a first dielectric layer and a first dummy gate are sequentially formed on the first surface of the first area. A second dielectric layer and a second dummy gate are formed on the second surface of the second area. An inter-layer dielectric layer is formed around the first gate, the first dummy gate and the second dummy gate. The first dummy gate and the second dummy gate are removed, so as to form a first trench and a second trench in the inter-layer dielectric layer. A second gate and a third gate are filled respectively in the first trench and the second trench.

8 Claims, 5 Drawing Sheets

(56) References Cited

U.S. PATENT DOCUMENTS

| | | |
|---|---|---|
| 8,022,468 B1 | 9/2011 | Ngo et al. |
| 8,518,775 B2 | 8/2013 | Liu et al. |
| 2007/0205458 A1 | 9/2007 | Yamamoto et al. |
| 2008/0273389 A1 | 11/2008 | Aritome et al. |
| 2013/0043522 A1 | 2/2013 | Hsu et al. |
| 2016/0148847 A1* | 5/2016 | Lee .................. H01L 21/82385 438/199 |

* cited by examiner

METHOD OF FORMING SEMICONDUCTOR STRUCTURE

CROSS-REFERENCE TO RELATED APPLICATION

This application is a divisional application of and claims the priority benefit of U.S. application Ser. No. 14/937,514, filed on Nov. 10, 2015, now pending, which claims the priority benefit of Taiwan application serial no. 104132650, filed on Oct. 2, 2015. The entirety of each of the above-mentioned patent applications is hereby incorporated by reference herein and made a part of this specification.

BACKGROUND OF THE INVENTION

Field of Invention

The present invention is related to an integrated circuit device and a method of forming the same, and more generally to a semiconductor structure and a method of forming the same.

Description of Related Art

With the development of a multi-functional chip, integrating elements with different functions, e.g., a memory and a metal-oxide-semiconductor (MOS) transistor, into the same chip has become the mainstream in the market. However, the process for fabricating a memory is commonly separated from the process for fabricating a MOS transistor. Hence, multiple photo-masks and complicated process steps are required, so as to increase the process cost and weaken the competitiveness. Therefore, how to effectively integrate a memory and a MOS transistor has been drawn high attention in the industry.

SUMMARY OF THE INVENTION

Accordingly, the present invention provides a semiconductor structure and a method of forming the same, in which a memory device can be fabricated at the same time during the process of forming a metal gate, so as to effectively integrate different elements with different functions into a single chip.

The present invention provides a semiconductor structure including a substrate, a first gate, a second gate, a third gate and an inter-gate dielectric layer. The substrate has a first area and a second area, and the first surface of the first area is lower than the second surface of the second area. The first gate is disposed on the first surface of the first area. The second gate includes metal and is disposed on the first gate. The inter-gate dielectric layer is disposed between the first and second gates. The third gate includes metal and is disposed on the second surface of the second area.

According to an embodiment of the present invention, a surface of the inter-gate dielectric layer is substantially coplanar with the second surface.

According to an embodiment of the present invention, the semiconductor structure further includes a fourth gate disposed on the first surface at one side of the first gate.

According to an embodiment of the present invention, each of the first gate and the fourth gate includes a silicon-containing material.

According to an embodiment of the present invention, the semiconductor structure further includes a plurality of first doped regions and a plurality of second doped regions. The first doped regions are disposed in the substrate beside the first gate and beside the fourth gate, wherein the first gate and the fourth gate share one of the first doped regions. The second doped regions are disposed in the substrate beside the third gate.

According to an embodiment of the present invention, the inter-gate dielectric layer includes an ONO dielectric layer, a high-dielectric-constant (high-k) layer having a dielectric constant of greater than about 10 or a combination thereof.

According to an embodiment of the present invention, the first area is a cell area, and the second area is a periphery area.

According to an embodiment of the present invention, the semiconductor structure further includes a first insulating layer disposed between the first gate and the substrate, and a second insulating layer disposed between the third gate and the substrate.

According to an embodiment of the present invention, the semiconductor structure further includes a high-k layer having a dielectric constant of greater than about 10 disposed between the third gate and the second insulating layer.

According to an embodiment of the present invention, the first gate is a floating gate, the second gate is a control gate, and the third gate is a logic gate.

The present invention further provides a method of forming a semiconductor structure including the following steps. A substrate having a first area and a second area is provided, wherein a first surface of the first area is lower than a second surface of the second area. A first insulating layer, a first gate, a first dielectric layer and a first dummy gate are sequentially formed on the first surface of the first area. A second dielectric layer and a second dummy gate are formed on the second surface of the second area. An inter-layer dielectric layer is formed around the first gate, the first dummy gate and the second dummy gate. The first dummy gate and the second dummy gate are removed, so as to form a first trench and a second trench in the inter-layer dielectric layer. A second gate and a third gate are filled respectively in the first trench and the second trench.

According to an embodiment of the present invention, each of the second gate and the third gate includes metal.

According to an embodiment of the present invention, a surface of the first dielectric layer is substantially coplanar with the second surface.

According to an embodiment of the present invention, the method further includes forming a fourth gate on the first surface at one side of the first gate, wherein the fourth gate and the first gate are formed simultaneously.

According to an embodiment of the present invention, a method of forming the first gate, the first dummy gate, the second dummy gate and the fourth gate includes the following steps. A first insulating material layer and a first conductive layer are sequentially formed on the substrate in the first area. A first dielectric material layer is formed on the first conductive layer in the first area and a second dielectric material layer is formed on the substrate in the second area. A second conductive layer is formed on the first dielectric material layer and on the second dielectric material layer. A first patterning step is performed, so as to form a first stacked structure and a second stacked structure on the substrate in the first area, wherein the first stacked structure includes the first insulating layer, the first gate, the first dielectric layer and the first dummy gate. A second patterning step is performed, so as to form the second dielectric layer and the second dummy gate on the substrate in the second area, wherein during the second patterning step, a portion of the second stacked structure is simultaneously removed and the fourth gate remains.

According to an embodiment of the present invention, each of the first conductive layer and the second conductive layer includes a silicon-containing material.

According to an embodiment of the present invention, the method further includes forming a plurality of first doped regions and forming a plurality of second doped regions. The first doped regions are formed in the substrate beside the first gate and beside the fourth gate, wherein the first gate and the fourth gate share one of the first doped regions. The second doped regions are formed in the substrate beside the third gate.

According to an embodiment of the present invention, the first dielectric layer includes an ONO dielectric layer, a high-k layer having a dielectric constant of greater than about 10 or a combination thereof.

According to an embodiment of the present invention, the first area is a cell area, the second area is a periphery area.

According to an embodiment of the present invention, the first gate is a floating gate, the second gate is a control gate, and the third gate is a logic gate.

In view of the above, in the semiconductor structure of the invention, a floating gate in a cell area is located at a lower level, and a control gate in the cell area and a metal gate in a periphery area are formed simultaneously and located at an upper level. In such manner, the control gate of the invention is free of the damage during the polishing step to the metal gate. Besides, in the present invention, a memory device and a MOS transistor device can be easily integrated together with the existing high-k metal gate process, so the process cost is significantly reduced and the competitiveness is greatly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like elements.

FIG. 1A to FIG. 1H are schematic cross-sectional views of a method of forming a semiconductor structure according to an embodiment of the present invention.

Figure 1A:
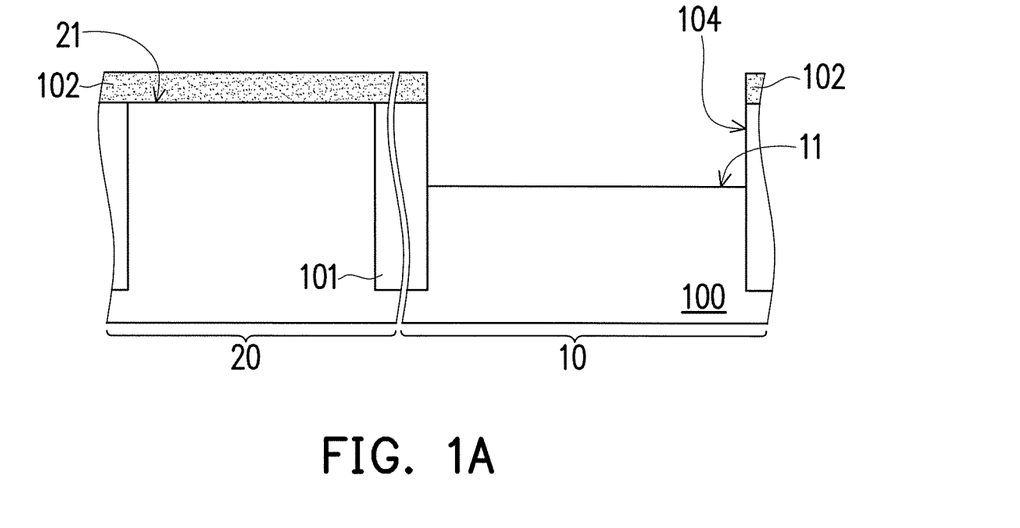
FIG. 1A to FIG. 1H are schematic cross-sectional views of a method of forming a semiconductor structure according to an embodiment of the present invention.

Referring to FIG. 1A, a substrate 100 is provided. The substrate 100 can be a semiconductor substrate, such as a silicon-containing substrate. The substrate 100 has a first area 10 and a second area 20. The first area 10 and the second area 20 are separated from each other by an isolation structure 101, such as a shallow trench isolation (STI) structure. In an embodiment, the first area 10 can be a cell area, the second area 20 can be a periphery area. In another embodiment, the first area 10 can be a memory device area, and the second area 20 can be a MOS device area or a low-voltage device area, but the present invention is not limited thereto.

In an embodiment, a first surface 11 of the first area 10 is lower than a second surface 21 of the second area 20. In an embodiment, a mask layer 102 is formed on the substrate 100, covering the second area 20 and the isolation structure 101. The mask layer 102 includes silicon nitride, and the forming method thereof includes performing a deposition process such as a chemical vapour deposition (CVD) process and a subsequent patterning step such as a photolithography and etching process. Thereafter, a portion of the substrate 100 in the first area 10 is removed by using the mask layer 102 as a mask, so as to form a recess 104 in the substrate 100 in the first area 10. The step of removing the portion of substrate 100 includes performing an etching process.

Figure 1B:
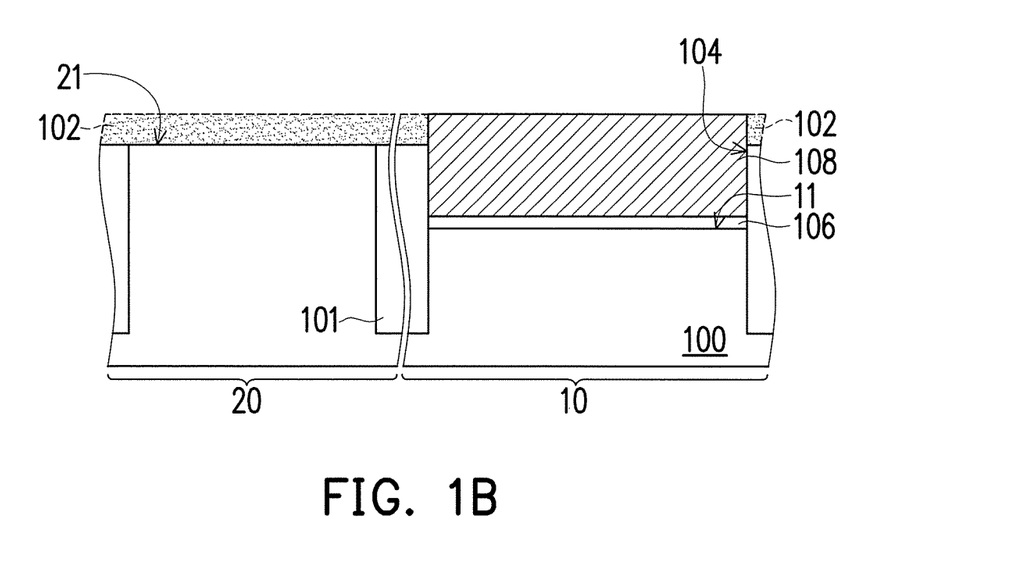

Referring to FIG. 1B, an insulating material layer 106 and a conductive layer 108 are sequentially formed on the substrate 100 in the first area 10. The insulating material layer 106 includes silicon oxide, and the forming method thereof includes performing a thermal oxidation process. The conductive layer 108 includes a silicon-containing material, such as polysilicon, amorphous silicon or a combination thereof. The method of forming the conductive layer 108 includes performing a deposition process (e.g., CVD), so as to form a conductive material layer (not shown) on the substrate 100 in the first area 10 and in the second area 20, and the conductive material layer fills in the recess 104. Thereafter, a chemical mechanical polishing (CMP) process is performed by using the mask layer 102 as a polish stop layer, so as to remove the conductive material layer outside of the recess 104. In an embodiment, the surface of the conductive layer 108 is substantially coplanar with the surface of the mask layer 102. The mask layer 102 is then removed.

Figure 1C:
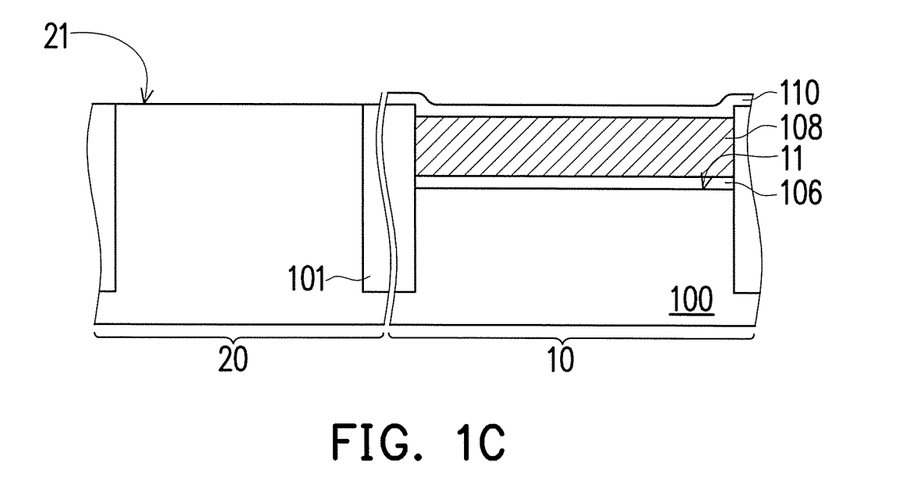

Referring to FIG. 1C, a portion of the conductive layer 108 is removed, so the surface of the remaining conductive layer 108 is no higher than the second surface 21 of the second area 20. In an embodiment, the surface of the conductive layer 108 in the first area 10 is lower than the second surface 21 of the second area 20, as shown in FIG. 1C. However, the present invention is not limited thereto. In another embodiment, the surface of the conductive layer 108 in the first area 10 is substantially coplanar with the second surface 21 of the second area 20. The step of removing the portion of the conductive layer 108 includes performing an etching back process.

Thereafter, a dielectric material layer 110 is formed on the conductive layer 108 in the first area 10. The dielectric material layer 110 includes an oxide-nitride-oxide (ONO) dielectric layer. In an embodiment, the distance from the surface of the conductive layer 108 to the second surface 21 is substantially equal to the thickness of the dielectric material layer 110, so the surface of the dielectric material layer 110 above the conductive layer 108 is substantially coplanar with the second surface 21 of the second area 20. The method of forming the dielectric material layer 110 includes performing multiple deposition processes (e.g., CVD), so as to form an ONO dielectric material layer (not shown) on the substrate 100 in the first area 10 and in the second area 20. Thereafter, the ONO dielectric material layer on the substrate 100 in the second area 20 is removed. In an embodiment, a photoresist layer (not shown) is formed on the ONO dielectric material layer to cover the first area 10 and expose the second area 20. Thereafter, the ONO dielectric material layer exposed by the photoresist layer is removed.

Figure 1D:
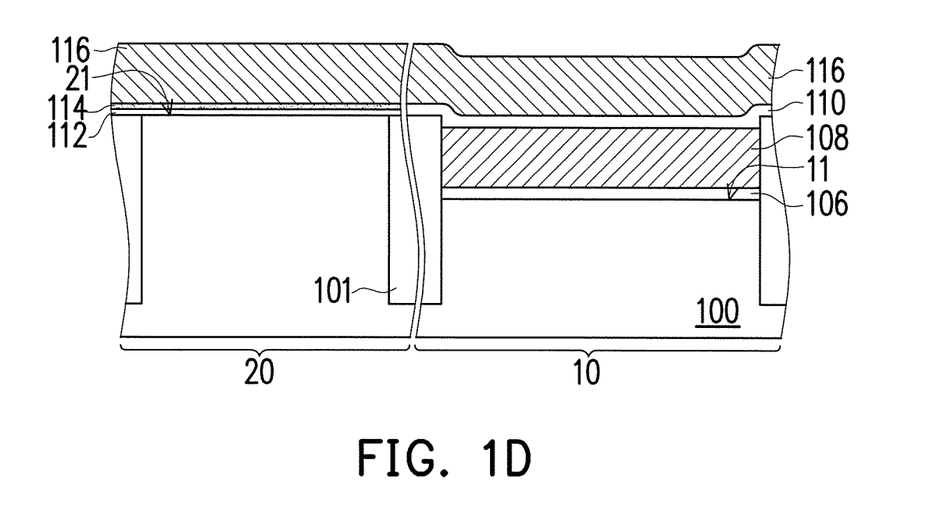

Referring to FIG. 1D, an insulating material layer 112 and a dielectric material layer 114 are formed on the substrate 100 in the second area 20. The insulating material layer 112 includes silicon oxide, and the forming method thereof includes performing a thermal oxidation process. The dielectric material layer 114 includes a high-dielectric-constant (high-k) layer. In an embodiment, the dielectric material layer 114 can be a high-k layer having a dielectric constant of greater than about 4, greater than about 7 or even greater than about 10. For example, the dielectric material layer 114 includes metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The method of forming the dielectric material layer 114 includes performing a deposition process (e.g., CVD), so as to form a high-k material layer (not shown) on the substrate 100 in the first area 10 and in the second area 20. Thereafter, the high-k material layer on the substrate 100 in the first area 10 is removed. In an embodiment, a photoresist layer (not shown) is formed on the substrate 100 to cover the second area 20 and expose the first area 10. Thereafter, the high-k material layer exposed by the photoresist layer is removed.

The said embodiment in which the dielectric material layer 110 in the first area 10 is formed prior to the formation of the dielectric material layer 114 in the second area 20 is provided for illustration purposes, and is not construed as limiting the present invention. In another embodiment, the dielectric material layer 110 in the first area 10 can be formed after the formation of the dielectric material layer 114 in the second area 20.

Thereafter, a conductive layer 116 is formed on the dielectric material layer 110 and on the dielectric material layer 114. The conductive layer 116 includes a silicon-containing material, such as polysilicon, amorphous silicon or a combination thereof, and the forming method thereof includes performing a suitable deposition process, such as a CVD process.

Figures 1E, 1F:
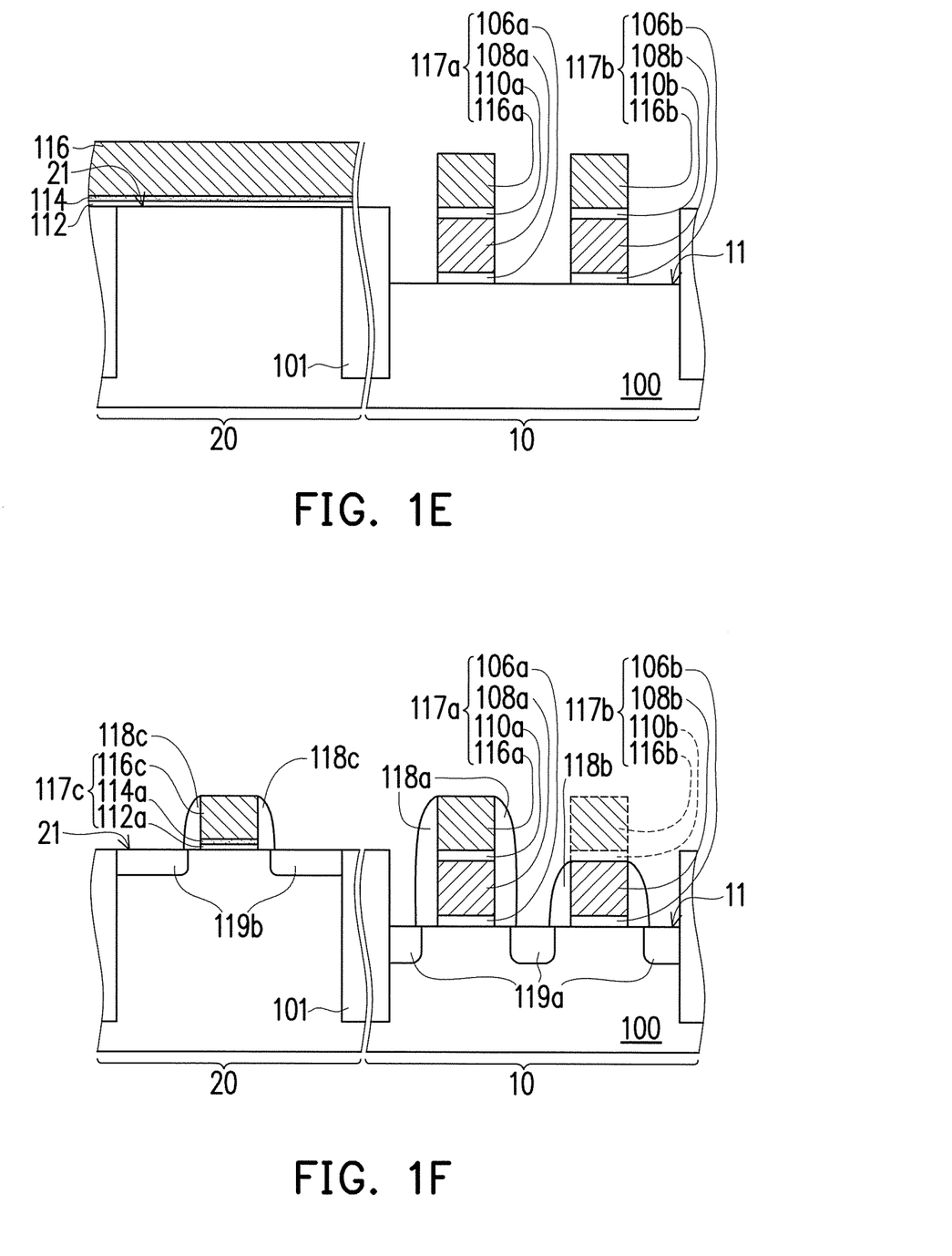

Referring to FIG. 1E, a first patterning step is performed, so as to form a first stacked structure 117a and a second stacked structure 117b on the substrate 100 in the first area 10. The first stacked structure 117a includes, from bottom to top, an insulating layer 106a, a gate 108a, a dielectric layer 110a and a dummy gate 116a. The second stacked structure 117b includes, from bottom to top, an insulating layer 106b, a gate 108b, a sacrificial dielectric layer 110b and a sacrificial gate 116b. The first patterning step includes performing a photolithography and etching process. In other words, the first patterning step can simultaneously define the gate 108a and the gate 108b in the first area 10.

Referring to FIG. 1F, a second patterning step is performed, so as to form a third stacked structure 117c on the substrate 100 in the second area 20. The third stacked structure 117c includes, from bottom to top, an insulating layer 112a, a dielectric layer 114a and a dummy gate 116c. The second patterning step includes performing a photolithography and etching process. In an embodiment, the second patterning step simultaneously removes a portion of the second stacked structure 117b. Specifically, during the second patterning step, the sacrificial dielectric layer 110b and the sacrificial gate 116b of the second stacked structure 117b are removed, and the insulating layer 106b and the gate 108b remain.

Thereafter, spacers 118a, 118b and 118c are respectively formed on sidewalls of the dummy gate 116a, the gate 108b and the dummy gate 116c. The method of forming the spacers 118a, 118b and 118c includes forming a spacer material layer (not shown) on the substrate 100, and performing an anisotropic etching process to remove a portion of the spacer material layer.

Afterwards, a plurality of doped regions 119a is formed in substrate 100 beside the gate 108a and beside the gate 108b, and a plurality of doped regions 119b is formed in the substrate 100 beside the gate 116b. In an embodiment, the gate 108a and the gate 108b share one of the doped regions 119a, and two of the doped regions 119 are located at outer sides of the gate 108a and the gate 108b. The method of forming the doped regions 119a and 119b includes performing an ion implantation process.

Figure 1G:
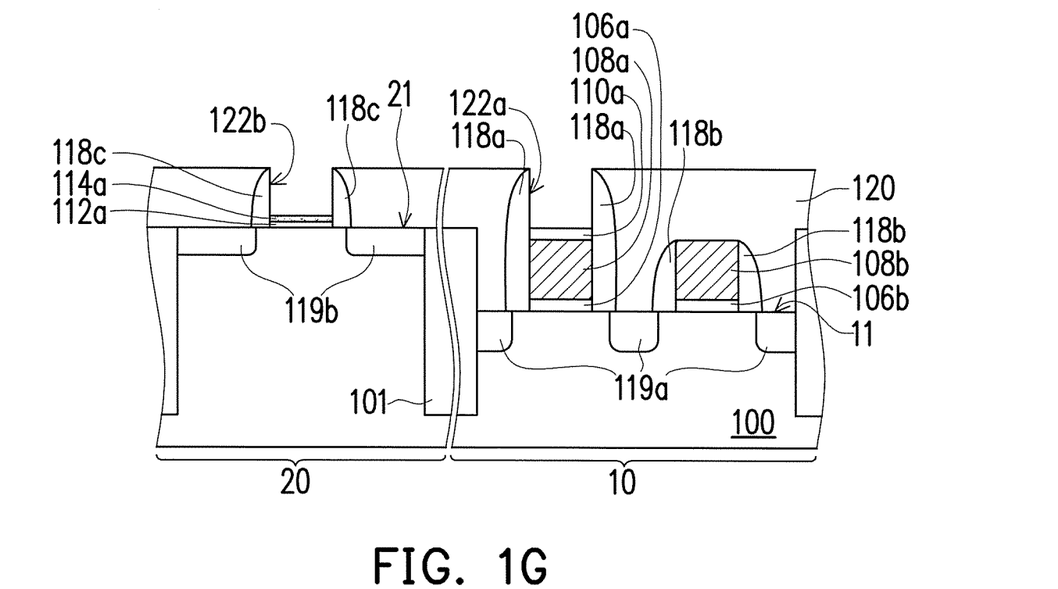

Referring to FIG. 1G, an inter-layer dielectric layer 120 is formed around the dummy gate 116a, the gate 108b and the dummy gate 116c. In an embodiment, the inter-layer dielectric layer 120 covers the gate 108b, surrounds the sidewalls of the dummy gate 116a and dummy gate 116c and exposes the tops of the dummy gate 116a and the dummy gate 116c. The inter-layer dielectric layer 120 includes silicon oxide, borophosphosilicate glass (BPSG), phosphosilicate glass (PSG), undoped silicate glass (USG), fluorosilicate glass (FSG), spin-on glass (SOG), a low-dielectric-constant (low-k) material having a dielectric constant of lower than about 4 or a combination thereof. The method of forming the inter-layer dielectric layer 120 includes performing a spin coating process or a suitable deposition process such as CVD. In an embodiment, an etch stop layer (not shown) can be foil led between the inter-layer dielectric layer 120 and each of the spacers 120a, 120b and 120c and between the inter-layer dielectric layer 120 and the substrate 100.

Thereafter, the dummy gate 116a and the dummy gate 116c are removed, so as to form a trench 122a and a trench 122b in the inter-layer dielectric layer 120. The method of removing the dummy gates 116a and 116c includes performing an etching process. In this embodiment, the trench 122a and the trench 122b respectively expose the dielectric layer 110a and the dielectric layer 114a.

Figure 1H:
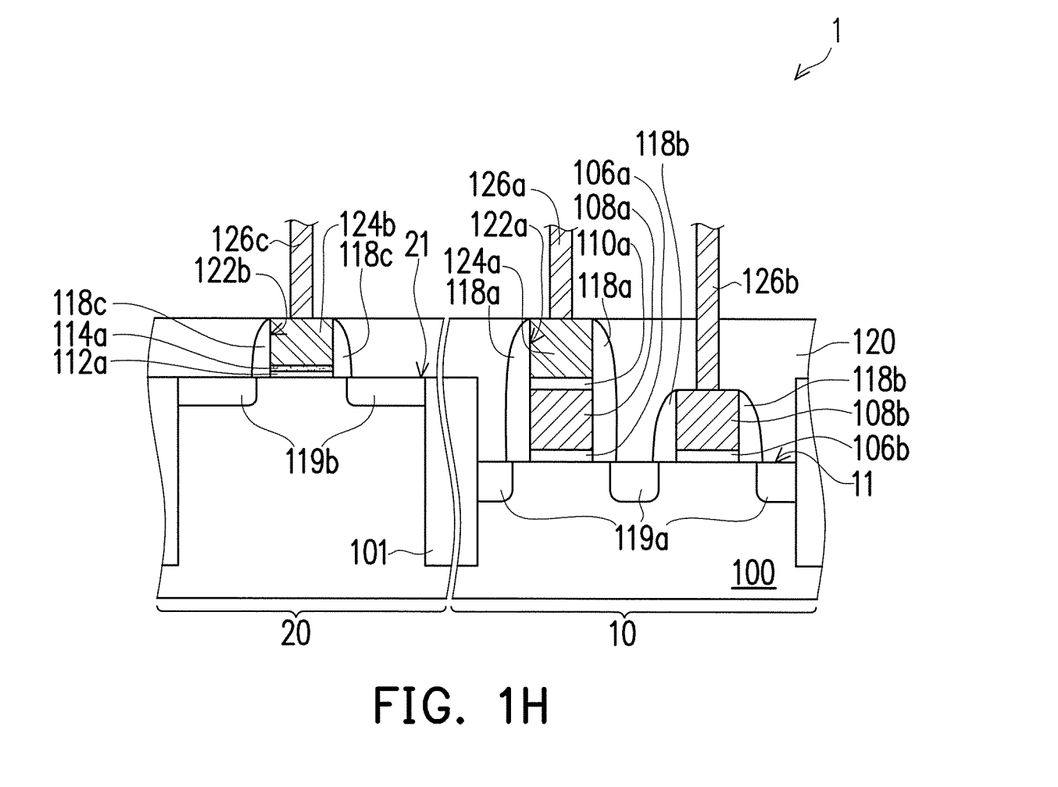

Referring to FIG. 1H, a gate 124a and a gate 124b are respectively filled in the trench 122a and the trench 122b. Each of the gate 124a and the gate 124b includes metal. In an embodiment, each of the gates 124a and 124b includes a work function metal layer and a low resistivity metal layer (not shown). The work function metal layer includes titanium nitride (TiN), titanium carbide (TiC), tantalum nitride (TaN), tantalum carbide (TaC), tungsten carbide (WC), aluminum titanium nitride (TiAlN), titanium aluminide (TiAl), zirconium aluminide (ZrAl), tungsten aluminide (WAl), tantalum aluminide (TaAl), hafnium aluminide (HfAl) or a combination thereof. The low resistivity metal layer includes Cu, Al or an alloy thereof. The method of forming the gates 124a and 124b includes performing at least one suitable deposition process (e.g., CVD), so as to form a metal material layer (not shown) on the substrate 100 filling in the trenches 122a and 122b in the first and second areas 10 and 20. Thereafter, a CMP process is performed by using the inter-layer dielectric layer 120 as a polish stop layer, so as to remove the metal material layer outside of the trenches 122a and 122b. Thereafter, conductive plugs 126a, 126b and 126c are formed to electrically connect to the gate 124a, the gate 108b and the gate 124b, respectively. The fabrication of the semiconductor structure 1 of the invention is thus completed.

In view of the above, the present invention provides a method of forming a semiconductor structure. A substrate 100 having a first area 10 and a second area 20 is provided, and a first surface 11 of the first area 10 is lower than a second surface 21 of the second area 20. A gate 108a, a dielectric layer 110a and a gate 124a are sequentially formed on the first surface 11 of the first area 10. A gate 124b is formed on the second surface 21 of the second area 20. It is noted that, the gates 124a and 124b include metal and can be formed simultaneously. In an embodiment, a gate 108b is optionally formed on the first surface 11 at one side of the gate 108a, and the gates 108b and 108a can be formed simultaneously.

In this embodiment, in the memory device in the first area 10, the insulating layer 106a serves as a tunnel insulating layer, the gate 108a serves as a floating gate, the dielectric layer 110a serves as an inter-gate dielectric layer, and the gate 124a serves as a control gate. Besides, the insulating layer 106b serves as a select gate insulating layer, and the gate 108b serves as a select gate. In the MOS transistor device in the second area 20, the dielectric layer 114a serves as a gate dielectric layer, and the gate 124b serves as a logic gate.

In the conventional method, the metal gate of a MOS transistor device is usually at a level lower than that of the control gate of a memory device, so the control gate is subjected to damage during the polishing step to the metal gate in an integrated process of forming a memory cell and a metal gate MOS transistor. However, in the present invention, since the control gate (e.g., gate 124a) in the first area 10 is fabricated simultaneously and formed at substantially the same level with the metal gate (e.g., gate 124b) in the second area 20, so the control gate of the invention is free of the damage during the polishing step to the metal gate.

Figure 2:
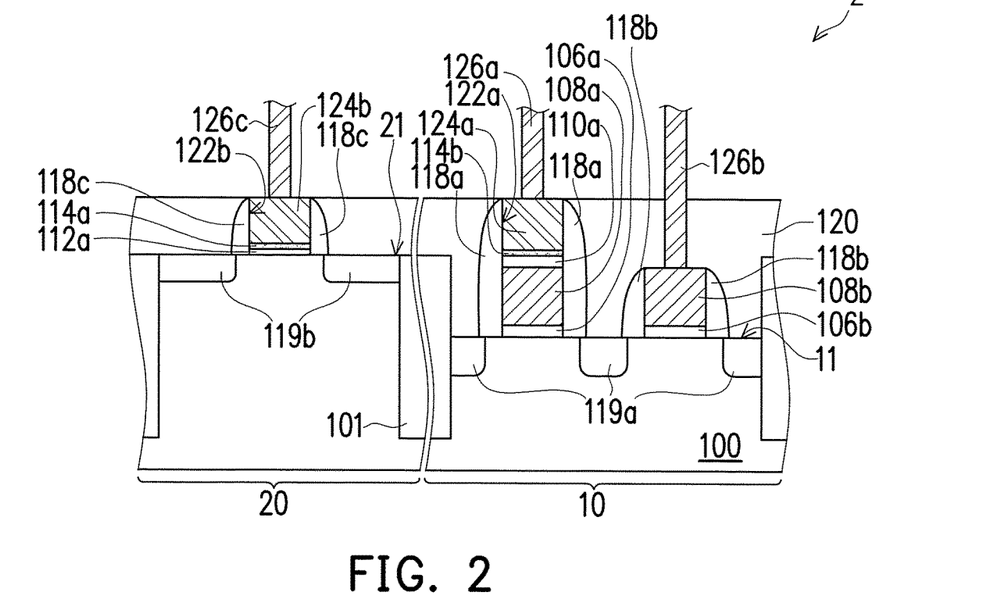
FIG. 2 is a schematic cross-sectional view of a semiconductor structure according to another embodiment of the present invention.

In an embodiment, the step of FIG. 1D can be modified as follows. The dielectric material layer 114 can be further formed on the dielectric material layer 110 in the first area 10. Steps similar to those described in FIG. 1E to FIG. 1H are performed. A semiconductor structure 2 of FIG. 2 is thus fabricated. The semiconductor structure of FIG. 1H is similar to that of FIG. 2, and the difference between them lies in the composition of the inter-gate dielectric layer. Specifically, the inter-gate dielectric layer of FIG. 1H is merely constituted by the dielectric layer 110a, while the inter-gate dielectric layer of FIG. 2 is constituted by the dielectric layer 110a and the overlying dielectric layer 114b.

Figure 3:
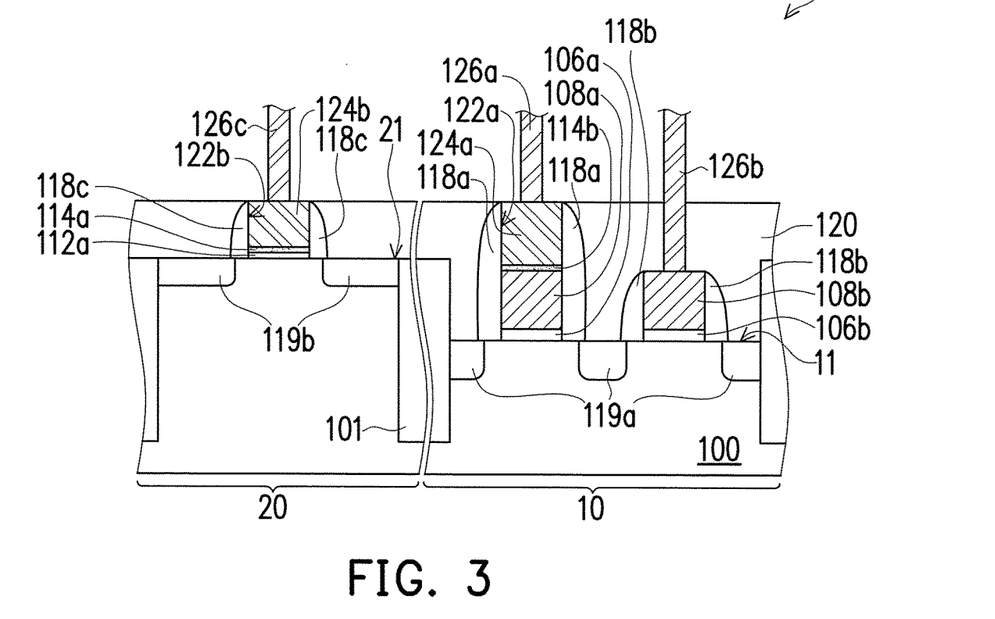
FIG. 3 is a schematic cross-sectional view of a semiconductor structure according to yet another embodiment of the present invention.

In another embodiment, the step of the FIG. 1D can be modified as follows. The step of forming the dielectric material layer 110 is omitted, and the dielectric material layer 114 can be further formed on the conductive layer 108 in first area 10. Steps similar to those described in FIG. 1E to FIG. 1H are performed. A semiconductor structure 3 of FIG. 3 is thus fabricated. The semiconductor structure of FIG. 1H is similar to that of FIG. 3, and the difference between them lies in the composition of the inter-gate dielectric layer. Specifically, the inter-gate dielectric layer of FIG. 1H is merely constituted by the dielectric layer 110a, while the inter-gate dielectric layer of FIG. 3 is merely constituted by the dielectric layer 114b.

The said embodiments in which the fabricating process of the memory device of the invention is integrated with that of the metal gate (high-k first) process are provided for illustration purposes, and are not construed as limiting the present invention. It is appreciated by people having ordinary skill in the art that the fabricating process of the memory device of the invention can be integrated with that of the metal gate (high-k last) process.

The semiconductor structures of the present invention are illustrated below with reference to FIG. 1H, FIG. 2 and FIG. 3.

The semiconductor structure 1/2/3 of the invention includes a substrate 100. The substrate 100 has a first area 10 and a second area 20, and a first surface 11 of the first area 10 is lower than a second surface 21 of the second area 20. In an embodiment, the first area 10 is a cell area, and the second area 20 is a periphery area.

In the first area 10, a first insulating layer (e.g., insulating layer 106a), a first gate (e.g., gate 108a), a second gate (e.g., gate 124a) and an inter-gate dielectric layer are further included in the semiconductor structure of the invention to constitute a charge storage structure together. The first gate (e.g., gate 108a) as a floating gate is disposed on the first surface 11 of first area 10. The second gate (e.g., gate 124a) as a control gate is disposed on the first gate. In an embodiment, the first gate includes a silicon-containing material, and the second gate includes metal. The insulating layer 106a as a tunnel insulating layer is disposed between the first gate and the substrate 100. The inter-gate dielectric layer is disposed between the second gate and the first gate. The inter-gate dielectric layer includes an ONO composite layer, a high-k layer having a dielectric constant greater than about 10 or a combination thereof. In an embodiment, the inter-gate dielectric layer is merely constituted by the dielectric layer 110a (e.g., ONO dielectric layer), as shown in FIG. 1H. In another embodiment, the inter-gate dielectric layer is constituted by the dielectric layer 110a (e.g., ONO dielectric layer) and the dielectric layer 114b (e.g., high-k layer), as shown in FIG. 2. In yet another embodiment, the inter-gate dielectric layer is merely constituted by the dielectric layer 114b (e.g., high-k layer), as shown in FIG. 3. In an embodiment, by controlling the distance from the surface of the first gate to the second surface, the surface of the inter-gate dielectric layer can be substantially coplanar with second surface 21.

In the first area 10, an insulating layer (e.g., insulating layer 106b) and a fourth gate (e.g., gate 108b) are further included in the semiconductor structure of the invention to constitute a select transistor together. The fourth gate (e.g., gate 108b) as a select gate is disposed on the first surface 11 at one side of the first gate (e.g., gate 108a). The fourth gate includes a silicon-containing material. The insulating layer 106b as a select gate insulating layer is disposed between the fourth gate and the substrate 100. Doped regions 119a are further disposed in the substrate 100 beside the first gate and beside the fourth gate in the first area 10, and first gate and fourth gate share one of the doped regions 119a.

In the second area 20, a second insulating layer (e.g., insulating layer 112a), a high-k layer (e.g., dielectric layer 114a) and a third gate (e.g., gate 124b) are further included in the semiconductor structure of the invention to constitute a logic transistor together. The third gate (e.g., gate 124b) as a logic gate is disposed on the second surface 21 of the second area 20, and the third gate includes metal. The high-k layer is disposed between the third gate and the second insulating layer. Doped regions 119b are further disposed in the substrate 100 beside the third gate 124b in the second area 20.

In summary, in the semiconductor structure of the invention, a floating gate in a cell area is located at a lower level, and a control gate in the cell area and a metal gate in a periphery area are formed simultaneously and located at an upper level. In such manner, the control gate of the invention is free of the damage during the polishing step to the metal gate. Besides, in the present invention, a memory device and a MOS transistor device can be easily integrated together with the existing high-k metal gate process, so the process cost is significantly reduced and the competitiveness is greatly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor structure, comprising:
   providing a substrate having a first area and a second area, wherein a first surface of the first area is lower than a second surface of the second area;
   sequentially forming a first insulating layer, a first gate, a first dielectric layer and a first dummy gate on the first surface of the first area;
   forming a second dielectric layer and a second dummy gate on the second surface of the second area;
   forming an inter-layer dielectric layer around the first gate, the first dummy gate and the second dummy gate;
   removing the first dummy gate and the second dummy gate, so as to form a first trench and a second trench in the inter-layer dielectric layer; and
   filling a second gate and a third gate respectively in the first trench and the second trench,
   wherein the method further comprises forming a fourth gate on the first surface at one side of the first gate, and the fourth gate and the first gate are formed simultaneously, and
   wherein the method of forming the first gate, the first dummy gate, the second dummy gate and the fourth gate comprises:
      sequentially forming a first insulating material layer and a first conductive layer on the substrate in the first area;
      forming a first dielectric material layer on the first conductive layer in the first area and forming a second dielectric material layer on the substrate in the second area;
      forming a second conductive layer on the first dielectric material layer and on the second dielectric material layer;
      performing a first patterning step, so as to form a first stacked structure and a second stacked structure on the substrate in the first area, wherein the first stacked structure comprises the first insulating layer, the first gate, the first dielectric layer and the first dummy gate; and
      performing a second patterning step, so as to form the second dielectric layer and the second dummy gate on the substrate in the second area, wherein during the second patterning step, a portion of the second stacked structure is simultaneously removed and the fourth gate remains.

2. The method of claim 1, wherein each of the second gate and the third gate comprises metal.

3. The method of claim 1, wherein a surface of the first dielectric layer is substantially coplanar with the second surface.

4. The method of claim 1, wherein each of the first conductive layer and the second conductive layer comprises a silicon-containing material.

5. The method of claim 1, further comprising:
   forming a plurality of first doped regions in the substrate beside the first gate and beside the fourth gate, wherein the first gate and the fourth gate share one of the first doped regions; and
   forming a plurality of second doped regions in the substrate beside the third gate.

6. The method of claim 1, wherein the first dielectric layer comprises an ONO dielectric layer, a high-k layer having a dielectric constant of greater than about 10 or a combination thereof.

7. The method of claim 1, wherein the first area is a cell area, the second area is a periphery area.

8. The method of claim 1, wherein the first gate is a floating gate, the second gate is a control gate, and the third gate is a logic gate.

* * * * *